(12) United States Patent
Warm et al.

(10) Patent No.: US 7,990,520 B2
(45) Date of Patent: Aug. 2, 2011

(54) MICROLITHOGRAPHY ILLUMINATION SYSTEMS, COMPONENTS AND METHODS

(75) Inventors: Berndt Warm, Schwaig (DE); Guenther Dengel, Heidenheim (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 775 days.

(21) Appl. No.: 11/957,647

(22) Filed: Dec. 17, 2007

(65) Prior Publication Data

US 2008/0212059 A1  Sep. 4, 2008

(30) Foreign Application Priority Data

Dec. 18, 2006 (DE) .................. 10 2006 060 101

(51) Int. Cl.
*G01J 1/00* (2006.01)
*G03B 27/42* (2006.01)
*G03B 27/54* (2006.01)
*G03B 27/74* (2006.01)

(52) U.S. Cl. ............... 355/68; 355/53; 355/67; 356/121

(58) Field of Classification Search ............... 250/201.1, 250/492.2, 548; 355/53, 67, 68, 71, 77; 356/121–122; 359/364–366, 850–866
See application file for complete search history.

(56) References Cited

U.S. PATENT DOCUMENTS

| | | | |
|---|---|---|---|
| 6,195,201 B1 | 2/2001 | Koch et al. | |
| 6,452,661 B1 | 9/2002 | Komatsuda | |
| 6,658,084 B2 | 12/2003 | Singer | |
| 2002/0085286 A1* | 7/2002 | Drodofsky et al. | 359/619 |
| 2003/0227603 A1* | 12/2003 | Dierichs | 355/47 |
| 2004/0114123 A1 | 6/2004 | Mudler et al. | |
| 2005/0270513 A1* | 12/2005 | Dierichs et al. | 355/67 |
| 2008/0113281 A1* | 5/2008 | Maul et al. | 430/7 |

FOREIGN PATENT DOCUMENTS

| | | |
|---|---|---|
| DE | 100 43 315 C1 | 6/2002 |
| DE | 10 2004 063 314 A1 | 7/2006 |
| EP | 1 291 721 A1 | 3/2003 |
| WO | WO 2006/136353 | 12/2006 |

* cited by examiner

*Primary Examiner* — Hung Henry Nguyen
*Assistant Examiner* — Colin Kreutzer
(74) *Attorney, Agent, or Firm* — Fish & Richardson P.C.

(57) ABSTRACT

The disclosure relates to microlithography systems, such as EUV microlithography illumination systems, as well as related components, systems and methods.

14 Claims, 5 Drawing Sheets

MICROLITHOGRAPHY ILLUMINATION SYSTEMS, COMPONENTS AND METHODS

CROSS-REFERENCE TO RELATED APPLICATION

This application claims priority under 35 U.S.C. §119 to German patent application serial number 10 2006 060 101.7, filed Dec. 18, 2006, which is hereby incorporated by reference.

FIELD

The disclosure relates to microlithography systems, such as EUV microlithography illumination systems, as well as related components, systems and methods.

BACKGROUND

Projection exposure apparatuses for use in microlithography are known.

SUMMARY

The disclosure relates to microlithography systems, such as EUV microlithography illumination systems, as well as related components, systems and methods.

In one aspect, the disclosure provides an EUV microlithography illumination system. The system includes an illumination optics designed so that, during use, the illumination optics can guide light from a radiation source to an object field in an object plane. The system also includes an illumination-angle sensor element designed so that, during use, the illumination-angle sensor can determine an actual illumination-angle distribution of a projection exposure apparatus in a field plane of the illumination optics. The system further includes an illumination-angle evaluation device including a signal connection to the illumination-angle sensor element, the illumination-angle evaluation device being designed so that, during use, a nominal illumination-angle distribution is stored via the illumination-angle evaluation device. In addition, the system includes an illumination-angle control device including a signal connection to the illumination-angle evaluation device, the illumination-angle control device being designed so that, during use, the illumination-angle control device generates an illumination-angle control signal depending on a difference between the actual illumination-angle distribution and the nominal illumination-angle distribution. The system also includes at least one movable illumination-angle diaphragm device including a signal connection to the illumination-angle control device, the at least one movable illumination-angle diaphragm device being configured so that, during use, the at least one illumination-angle diaphragm device can move at least one illumination-angle diaphragm body to achieve an adjustable, partial attenuation of the light in the area of a pupil plane of the illumination optics.

In another aspect, the disclosure provides a projection exposure apparatus for EUV microlithography. The apparatus includes an illumination optics designed so that, during use, the illumination optics can guide light from a radiation source to an object field in an object plane. The apparatus also includes a projection optics designed so that, during use, the projection optics can image the object field into an image field in an image plane. The apparatus further includes a field-distribution sensor element designed so that, during use, the field-distribution sensor element can determine an actual intensity distribution of the projection exposure apparatus in a field plane of the projection optics. In addition, the apparatus include a field-distribution evaluation device including a signal connection to the field-distribution sensor element, the field-distribution evaluation device being designed so that, during use, a nominal distribution of intensity over the field can be stored via the field-distribution evaluation device stored. The apparatus also includes a field-distribution control device including a signal connection to the field-distribution evaluation device, the field-distribution control device designed so that, during use, the field-distribution control device generates a signal depending on the difference between the actual intensity distribution and the nominal intensity distribution. The apparatus further includes at least one movable field-distribution diaphragm device including a signal connection to the field-distribution control device, the at least one movable field-distribution diaphragm device designed so that, during use, depending on the field-distribution control signal, at least one movable field-distribution diaphragm device moves at least one field-distribution diaphragm body to achieve an adjustable, partial attenuation of illumination light of the radiation source in the area of a field plane of the illumination optics.

In a further aspect, the disclosure provides a method that correcting an illumination parameter of an EUV microlithography projection exposure apparatus.

In an additional aspect, the disclosure provides a method that using a projection exposure apparatus according to project at least part of a mask onto an area of a photo-sensitive material (e.g., to make a microstructured device).

In some embodiments, the disclosure provides an illumination system designed so that illumination parameters, such as the ellipticity of the illumination-angle distribution, correspond more closely to desired values.

EUV (extreme ultraviolet) refers to a wavelength range, such as between 10 and 30 nm.

In some embodiments, the disclosure provides an illumination system for EUV microlithography including an illumination optics for guiding illumination light of a radiation source to an object field in an object plane;

an illumination-angle sensor element for determining an actual illumination-angle distribution of a projection exposure apparatus in a field plane of the illumination optics;

an illumination-angle evaluation device which is provided with a signal connection to the illumination-angle sensor element and in which a nominal illumination-angle distribution is stored;

an illumination-angle control device which is provided with a signal connection to the illumination-angle evaluation device and, depending on the difference between the actual illumination-angle distribution and the nominal illumination-angle distribution, generates an illumination-angle control signal;

and at least one movable illumination-angle diaphragm device which is provided with a signal connection to the illumination-angle control device and moves at least one illumination-angle diaphragm body to achieve an adjustable, partial attenuation of the illumination light of the radiation source in the area of a pupil plane of the illumination optics.

It was realized that the illumination-angle distribution in the object plane of the illumination system can be evaluated or monitored via a corresponding measurement, thus allowing for an automatic compensation mechanism to both detect and correct alterations of the illumination-angle distribution originating from misadjustment, thermal drifts or design effects. When putting the disclosure into practice, experiences from the UV microlithography with regard to diaphragm adjustment as a mechanism for changing the illumination angles may prove useful. Corresponding UV projection exposure apparatuses are known from DE 100 43 315 C1 and DE 10 2004 063 314 A1. Parameters characterizing the illumination-angle distribution can be automatically kept within default limits via the illumination system according to the disclosure. This can substantially increase the service life of a projection exposure apparatus, which is equipped with the illumination system according to the disclosure, until it should be shut down for maintenance, for example. Correspondingly, an increased throughput of the projection exposure apparatus can be obtained. The movable illumination-angle diaphragm device may be designed as a correction diaphragm which is integrated into the illumination system according to the disclosure in or adjacent to a pupil plane of a projection optics of a projection exposure apparatus, or is disposed in a plane which is conjugated thereto and attenuates the illumination of an entrance pupil of the projection optics in a way that at least some source images in the entrance pupil of the projection optics, which are associated with the individual facets of the pupil facet mirror, are partially shadowed by one and the same diaphragm edge. The diaphragm edge of such a correction diaphragm may be used to affect the illumination parameters telecentricity and ellipticity. This can allow for the attenuation or shadowing of the pupil facet mirror to be adapted to different radiation source geometries and different illumination settings. Attenuation via a correction diaphragm may occur directly adjacent to the pupil facet mirror so that individual facets of the pupil facet mirror itself are shadowed. Alternatively, the correction diaphragm may be disposed in the area of a pupil plane conjugated to the pupil facet mirror, i.e. not adjacent to the pupil facet mirror. In either case, either some individual facets or some source images associated with these individual facets are shadowed by one and the same diaphragm edge.

In certain embodiments, an illumination system may be provided with a sensor element which is capable of detecting the illumination angle distribution over the entire field plane and may for example be realized by inserting an output coupler by which the illumination-angle sensor element is exposed to the illumination light. In some embodiments, the sensor element may be exposed to the illumination light via a beam splitter. The illumination-angle sensor element which may be provided with a sensor element which is capable of detecting the illumination angle distribution over the entire field plane allows for complete monitoring of the illumination-angle distribution over the entire field.

In certain embodiments, an illumination system is provided with an illumination-angle sensor element which is capable of detecting the illumination-angle distribution in at least one field position by using illumination light at the edge of the cross-section of the illumination light, this allows for the illumination-angle distribution to be monitored during the projection operation of the illumination system.

An illumination-angle sensor element can include at least one deflection element for deflecting a detection beam path of the illumination-angle sensor element away from a main beam direction of the illumination light, e.g., by 90°, which can allow for a compact design of the illumination-angle sensor element.

An illumination-angle sensor element can detect the illumination-angle distribution by using illumination light at four edge positions of the beam cross-section of the illumination light, the edge positions defining the corners of a rectangle, may be used for illumination light to be obtained from areas where it is usually not, or only to a limited extent, needed for projection. This ensures that the projection process continues while being monitored by the illumination-angle sensor element.

An illumination-angle sensor element can be designed to detect the illumination angles and, at the same time, the integral of the illumination light arriving from all detected illumination angles may additionally be used as an energy/intensity sensor for monitoring the total performance of the radiation source.

An illumination-angle sensor element can include an apertured diaphragm at a position in a field plane, or a plane of the illuminated optics conjugated thereto, which may be exposed to illumination light, and a spatial detector element disposed downstream of the apertured diaphragm for detecting an intensity distribution which corresponds to the illumination-angle distribution at the site of the apertured diaphragm ensures a high-precision measurement of the illumination-angle distribution whilst providing a simple design.

A spatial detector element can include a CCD array as the spatial detector element can be provided with a conversion element converting the wavelength of the EUV illumination light into a wavelength detectable by the CCD array is very sensitive. A corresponding conversion element allows for the wavelength of the illumination light to be converted into a wavelength which is detectable by the CCD array. A response, which may depend on the angle of incidence of the illumination light when hitting the conversion element, i.e. an intensity of the wavelength depending on this angle of incidence, the wavelength being generated by the conversion element and detectable by the CCD array, can be determined prior to the actual illumination parameter measurement via a calibration measurement and deducted from the actual measurement. An incidence-angle dependence of the response of the conversion element then does not falsify the measurement result of the spatial detector element.

A diaphragm device can be provided with a plurality of individual diaphragm bodies which, starting from the edge, are insertable into an illuminated aperture of the pupil plane independently of each other allows for a flexible adjustment of the illumination-angle distribution.

Diaphragm bodies of an illumination system of the aforementioned type having an edge contour which can lead in the direction of insertion and can be adapted to an illumination substructure of the pupil plane to be shadowed allow for a defined shadowing to be obtained.

If, in an illumination system, the number of diaphragm bodies is adapted to the illumination parameters to be corrected, unwanted hunting effects during the correaction of the illumination parameters may be avoided. If, for example, the ellipticity of the illumination-angle distribution is to be monitored and corrected in two orientations, the energy or intensity, respectively, of exposure should be adjusted in octants obtained in the pupil plane. Correspondingly, it is advantageous in this case to use eight individual diaphragm bodies.

An insertion drive can cooperate with an individual diaphragm body and includes a guide unit for guiding the insertion movement as well as a pivotable lever arm which is articulated with a guide body which is guided in the guide unit and firmly connected to a base body of the individual diaphragm body and cooperates with a pivot drive motor ensures a high-precision insertion whilst providing a simple design. In some embodiments, the insertion drive may also be realized via, for example, a stepper motor.

A pivot drive motor can be configured as an electric motor in a way that a portion of the lever arm simultaneously forms a rotor of the electric motor includes a particularly low number of components.

In some embodiments, a projection exposure apparatus for the EUV microlithography can offer one or more advantages corresponding to those stated above with regard to the illumination system. Apart from correcting the illumination-angle distribution, another function of an illumination system of such a projection exposure apparatus is, correspondingly, to monitor and correct the uniformity particularly in the image plane of the projection optics. During the projection illumination, this can guarantee an illumination as homogeneous as possible of a photo-sensitive layer on the substrate to be exposed via a default radiation energy or intensity, respectively, thus ensuring that structures are transferred from the mask onto the substrate without any losses.

In certain embodiments, a diaphragm device can include a plurality of individual diaphragm bodies which are, starting from the edge, insertable into the illuminated aperture of the field plane independently of each other correspond to those of the diaphragm device of an illumination system described further above which is provided with a plurality of individual diaphragm bodies which, starting from the edge, are insertable into a illuminated aperture of the pupil plane independently of each other.

Individual, pivotable diaphragm bodies with which a field-distribution diaphragm device of a projection exposure apparatus of the aforementioned type may be equipped and which project from the edge into the illuminated aperture of the field plane independently of each other, with each individual diaphragm body being provided with a surface element which is pivotable about an axis having at least one component of direction which runs parallel to the field plane so as to change the size of an area shadowed by the individual diaphragm body, allow for a fine adjustment of the distribution of energy or intensity, respectively, of the illumination light in the field plane. It is particularly advantageous if the diaphragm bodies are both insertable and pivotable.

In certain embodiments, an individual diaphragm body can provide advantages corresponding to those of the individual diaphragm body described above, the individual diaphragm body having an edge contour that leads in the direction of insertion and is adapted to an illumination substructure of the pupil plane to be shadowed.

Individual diaphragm bodies of a projection exposure apparatus of the aforementioned type the shape of which may be adapted to the at least partial shadowing of particular individual field facets of the field facet mirror allow for a particularly fine adjustment of the distribution of energy or intensity, respectively, of the illumination light in the field plane.

An insertion and pivot drive of a projection exposure apparatus of the aforementioned type may cooperate with an individual diaphragm body, and thus may include a guide unit for guiding the insertion movement along a guide axis, a pivot drive motor for pivoting the individual diaphragm body about the guide axis, and a linear motor for moving the individual diaphragm body along the guide axis, also includes decoupled drives for the degrees of freedom insertion and pivoting.

EUV radiation absorbed by the diaphragm bodies and converted into heat can be dissipated efficiently via a cooling body to which an the individual diaphragm body of a projection exposure apparatus of the afore-mentioned type may be coupled, with the coupling advantageously being obtained via a flexible copper line.

In some embodiments, a method can offer advantages that correspond to the advantages of the projection exposure apparatus according to the disclosure. Methods for correcting an illumination parameter in a projection exposure apparatus for the EUV microlithography can allow for monitoring and correction of both ellipticity and telecentricity.

In certain embodiments, the methods can minimize the uniformity error of the field-plane intensity distribution in the projection exposure apparatus, and can allow to simultaneously monitor and correct the parameters controlling the illumination-angle distribution and the uniformity.

In some embodiments, the methods can be used to produce a microstructured component. In such embodiments, the correctable illumination parameters can enable a relatively constant, high structural resolution to be obtained over a long period of time.

A microstructured component according to at least one of the two aforementioned methods has corresponding advantages.

In the following, exemplified embodiments of the disclosure will be explained in more detail, taken in conjunction with the drawings.

DETAILED DESCRIPTION

Figure 1:
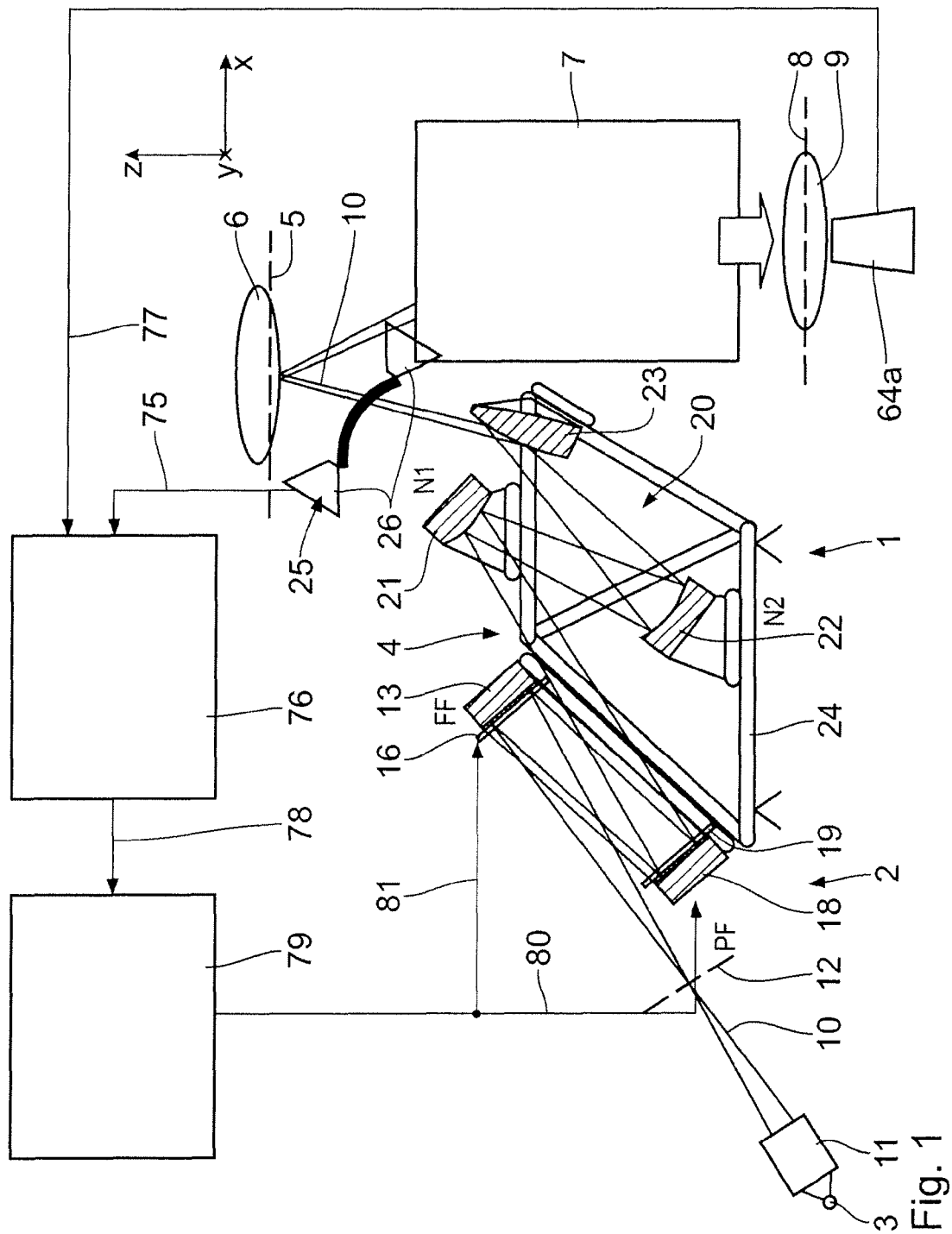
FIG. 1 shows a schematic meridional section through a projection exposure apparatus for EUV projection microlithography.

FIG. 1 shows a schematic meridional section of a projection exposure apparatus 1 for the microlithography. An illumination system 2 of the projection exposure apparatus 1 is provided with a radiation source 3 and an illumination optics 4 for illuminating an object field in an object plane 5. The radiation source 3 is an EUV source providing an emission wavelength of between 10 nm and 30 nm. A reticle 6 disposed in the object field is exposed to illumination. A projection optics 7 is used for imaging the object field into an image field in an image plane 8. A structure on the reticle is imaged onto a photo-sensitive layer of a wafer 9 disposed in the area of the image field in the image plane 8.

For easier representation, FIG. 1 is provided with a Cartesian coordinate system. The x-direction extends to the right in FIG. 1. The y-direction extends vertically into the drawing plane in FIG. 1. The z-direction extends upwards in FIG. 1. The displayed EUV radiation 10 hits the object plane 5 at x=0.

The projection exposure apparatus 1 is configured as a scanner. During the operation of the projection exposure apparatus 1, both the reticle 6 and the wafer 9 are scanned synchronously in the y-direction.

EUV radiation 10, which is emitted by the radiation source 3, is initially collimated by a collector 11. The collector 11 is configured as a nested collector mirror equipped with a plurality of mirror shells providing for a grazing reflection of the EUV radiation 10 (grazing incidence). The individual shells of the collector 11 are held in place via spokes which are disposed in the light path of the EUV radiation 10. Other configurations of the collector 11 are also conceivable.

Upon leaving the collector 11, the EUV radiation 10 propagates through an intermediate focal plane 12 before hitting a field facet mirror 13.

Figure 8:
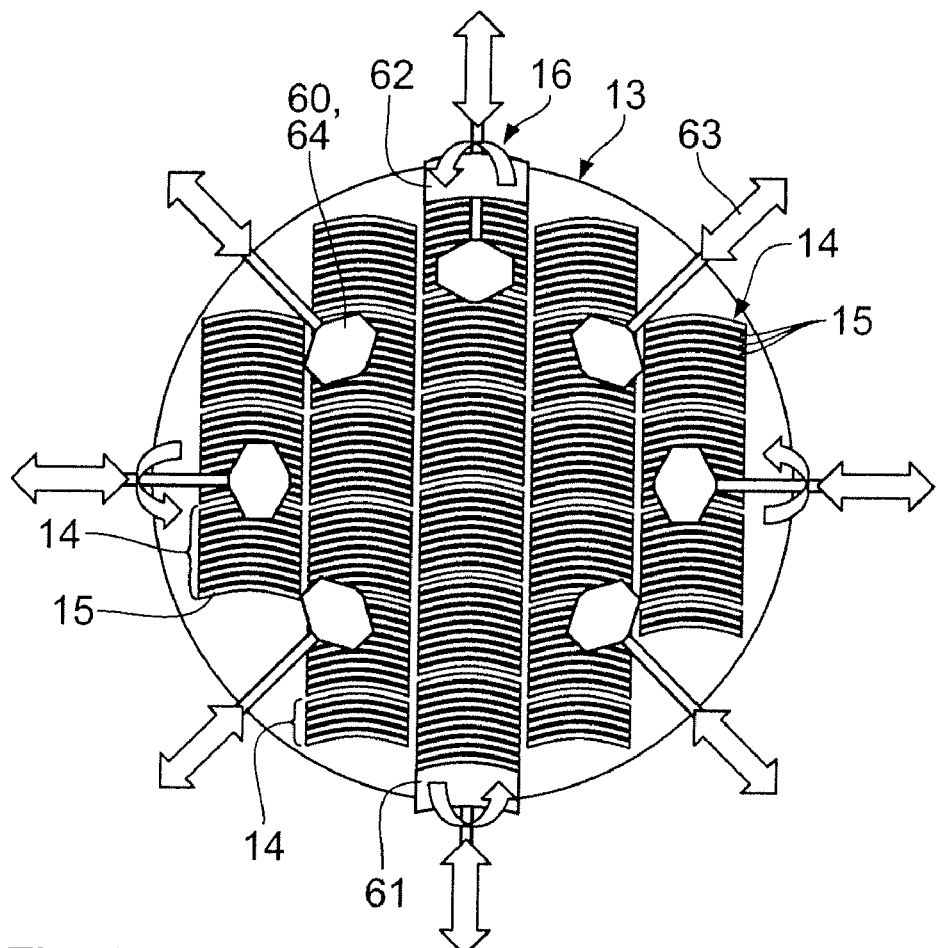
FIG. 8 shows a field facet mirror of the projection exposure apparatus of FIG. 1 equipped with a field-distribution diaphragm device.

FIG. 8 shows an enlarged plan view of the field facet mirror 13. This field facet mirror 13 is equipped with a plurality of field facet groups 14 arranged in columns and rows, the field facet groups 14 in turn being composed of a plurality of curved individual facets 15. Straight, i.e. non-curved, individual facets are also conceivable, as will be described in the following. The field facet mirror 13 is composed of several different types of field facet groups 14 which are equipped with a different number of individual facets 15. The field facet group 14 shown in the bottom left column of FIG. 8, for example, is subdivided into 10 individual facets 15. Other field facet groups 14 may also include a smaller number of individual facets 15. The individual field facets 15 of the field facet mirror 13 are arranged in the shape of the object field to be illuminated. Such field facet arrangements are for example known from U.S. Pat. No. 6,452,661 and U.S. Pat. No. 6,195, 201.

A field-distribution diaphragm device 16 adjoining the reflecting surface of the field facet mirror 13 in the beam path of the EUV radiation 10 is only indicated in FIG. 1 and will be described in more detail in the following.

Figure 5:
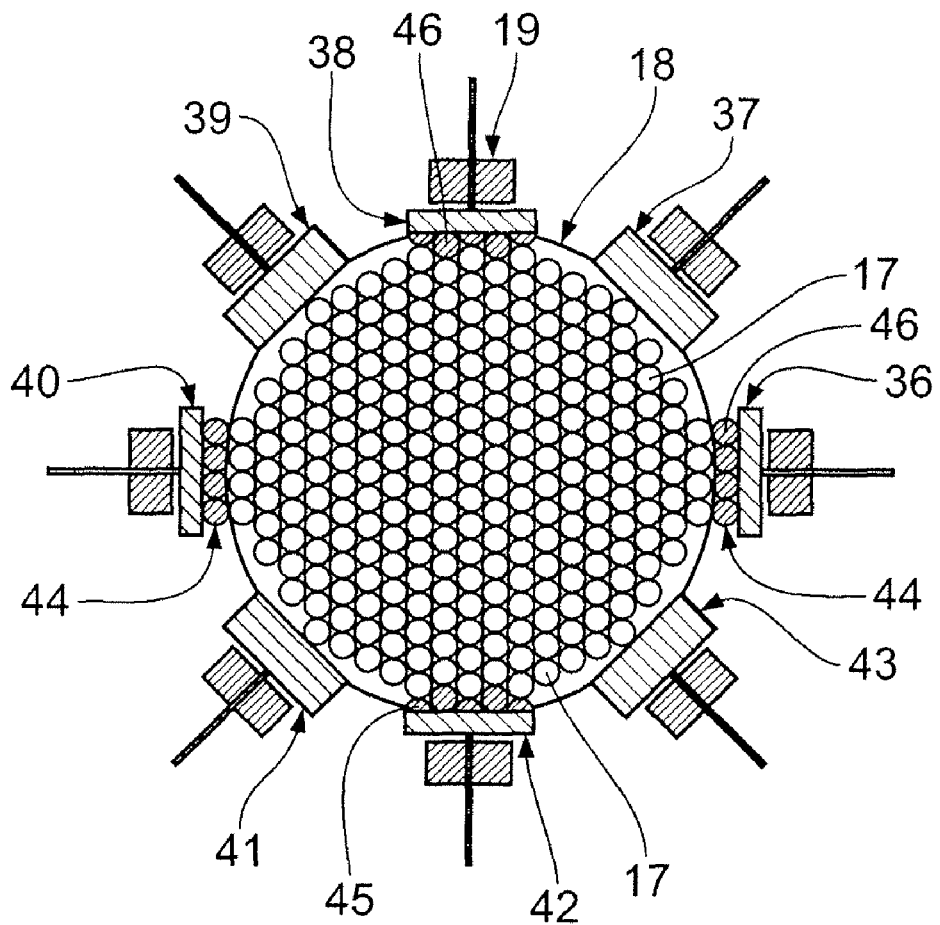
FIG. 5 shows a pupil facet mirror of the projection exposure apparatus of FIG. 1 equipped with a movable illumination-angle diaphragm device.

The EUV radiation 10 reflected by the field facet mirror 13 is composed of a plurality of partial radiation beams, with each partial beam being reflected by a particular individual facet 15. Each partial bundle hits an associated individual facet (cp. FIG. 5) of a pupil facet mirror 18. The individual pupil facets 17 are round and hexagonal close packed. The field facet mirror 13 is used to generate secondary light sources at the site of the individual facets 17 of the pupil facet mirror 18. The pupil facet mirror 18 is disposed in a plane of the illumination optics 4 which coincides with or is optically conjugated to a pupil plane of the projection optics 7. An illumination-angle diaphragm device 19, which will be described in more detail in the following, is disposed adjacent to the reflecting surface of the pupil facet mirror 18 in the beam path of the EUV radiation 10.

The individual field facets 15 of the field facet mirror 13 are imaged into the object plane via the pupil facet mirror 18 and a transmission optics 20. The trans-mission optics 20 is provided with three reflecting mirrors 21, 22 and 23 which are disposed downstream of the pupil facet mirror 18.

The entire illumination optics 4, i.e. the field facet mirror 13, the pupil facet mirror 18 and the three mirrors 21 to 23 of the transmission optics 20 are held in place on a common, rigid support frame in a way as to keep thermal drifts of the positions of the reflecting surfaces of these components to a minimum during the operation of the projection exposure apparatus 1. Due to the spatial conditions, it is generally impossible to attach the radiation source 3 and the collector 11 directly to the support frame 24.

Serving as an example of an illumination-angle sensor element, an ellipticity sensor 25 is disposed in the beam path between the last mirror 23 of the transmission optics 20 and the object plane 5 for determining an actual illumination-angle distribution of the projection exposure apparatus 1 in a field plane of the illumination optics 4.

Figure 2:
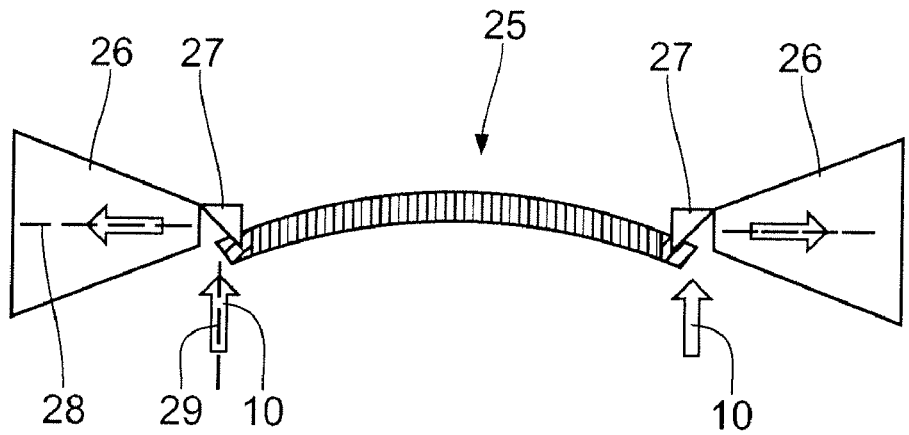
FIG. 2 shows, in a representation similar to FIG. 1, an enlarged ellipticity sensor of the projection exposure apparatus as an example of an illumination-angle sensor element.
Figure 3:
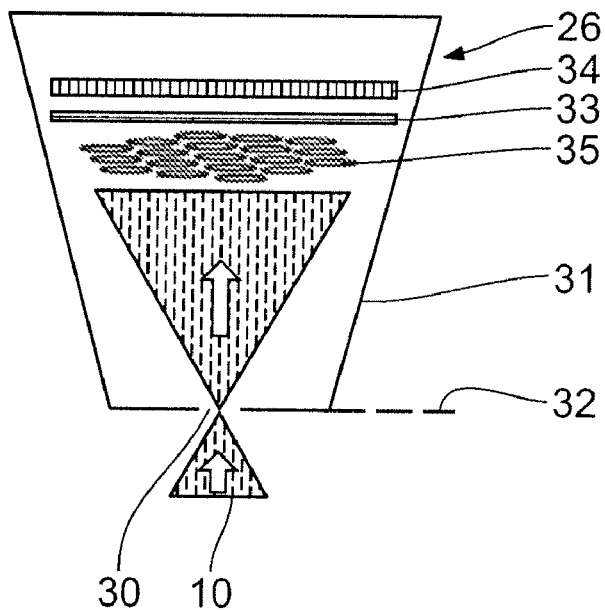
FIG. 3 shows an even larger view of a sensor unit of the ellipticity sensor of FIG. 2.
Figure 4:
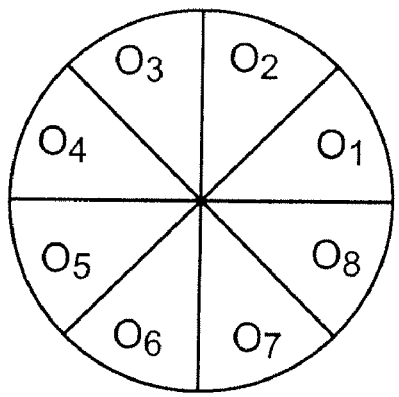
FIG. 4 shows a schematic view of an octant distribution of a pupil plane of the projection exposure apparatus of FIG. 1.

FIGS. 2 and 3 show details of the ellipticity sensor 25. This ellipticity sensor 25 includes a total of two sensor units 26 which are shown in FIGS. 1 and 2. FIG. 3 shows a detailed view of one of the sensor units 26. Alternative versions of the ellipticity sensor may also include more than two sensor units, e.g. four or eight sensor units. More than two sensor units may in particular be used if the measurable quantity referred to as ellipticity, which will be described in the following, is to be determined in more detail for determining scan-integrated values.

At the site of the ellipticity sensor 25, the cross-section of the EUV radiation 10 to which the object field is exposed has the shape of an arc. The two sensor units 26 are disposed at the edge positions of the illumination light, i.e. the EUV radiation 10, which are determined by the two ends of the arc-shaped cross-section, the sensor units 26 detecting the EUV radiation 10 impinging upon the edge positions, as shown in FIG. 2. The part of the EUV radiation 10 between these edge positions, which is by far the major part of the EUV radiation, passes through the ellipticity sensor 25 without being affected or attenuated. The EUV radiation 10 detected at the edge positions is in the following also referred to as detection radiation 10.

Due to the identical design of the two sensor units 26, it suffices in the following to describe one of the two sensor units 26 of the ellipticity sensor 25. First of all, the sensor unit 26 includes a deflection element 27 in the shape of a deflection mirror for deflecting a detection beam path 28 by 90°, i.e. away from a main beam direction 29 of the EUV radiation 10. The detection radiation 10 is subsequently guided through an apertured diaphragm 30 in a housing 31 of the sensor unit 26. The apertured diaphragm 30 has a round shape, with a diameter of between 100 and 300 μm. The apertured diaphragm 30 is disposed in a diaphragm plane 32 coinciding with a field plane or a plane of the projection optics 7 which is conjugated thereto. A scintillator plate 33 is the first element to be disposed downstream of the apertured diaphragm 30 in the housing 31. The scintillator plate 33 converts the EUV radiation 10 into detection radiation of a wavelength which is detectable by a spatial detector element 34 in the shape of a CCD array disposed downstream of the scintillator plate 33.

As indicated in FIG. 3, the detector element 34 detects an intensity distribution 35 which corresponds to an illumination-angle distribution at the site of the apertured diaphragm 30. Since the apertured diaphragm is disposed in a field plane or intermediate field plane, respectively, of the projection optics 7, the intensity distribution 35 serves as a measure for the illumination-angle distribution seen by an object point in the object field, with the object point being exposed to the EUV radiation 10.

The intensity of the detection radiation, which is obtained from the incident EUV radiation 10 via the scintillator plate 33, depends on the angle of incidence of the EUV radiation 10 when hitting the scintillator plate 33. If the EUV radiation 10 hits the scintillator plate 33 at a particular angle of incidence, the intensity of the detection radiation is maximized. For example, the scintillator plate 33 may be designed in a way that EUV radiation 10 hitting the scintillator plate 33 in a vertical direction is converted with maximum efficiency, the efficiency monotonically decreasing if the angle of incidence of the incident EUV radiation 10 increases. This dependence, which is also referred to as response function of the scintillator plate 33, can be determined exactly within the scope of a calibration measurement. This angle dependence of the detection radiation generated in the scintillator plate 33 can be determined from the signal detected by the CCD array via this default calibration function.

Apart from the detection of illumination angles, another function of the two spatial detector elements 34 of the sensor units 26 is to determine the integral of the EUV radiation 10 arriving from all detected illumination angles, or of the radiation converted by the scintillator plate 33, respectively. This integral is a measure for the total energy or intensity, respectively, which is provided by the illumination system 2.

The ellipticity sensor 25 allows to measure the illumination-angle distribution during the operation of the projection exposure apparatus 1. An alternative ellipticity sensor may serve to detect the illumination-angle distribution over the entire field plane. This alternative ellipticity sensor either allows for an output coupler to be introduced in the beam path of the EUV radiation 10, thus ensuring that the entire EUV radiation 10 is transferred to an illumination-angle detection system, or for decoupling a detection beam along the entire cross-section of the EUV radiation 10 via a beam splitter, with the largest part of the EUV radiation, in the shape of effective radiation, not being supplied to the ellipticity sensor but to the projection system. Measurement via the ellipticity sensor 25 can be performed during the replacement of a wafer.

The ellipticity, which is measurable via the ellipticity sensor 25, is a measure for determining the quality of illumination of the object field in the object plane 5. In this respect, the determination of the ellipticity helps to obtain exact information with regard to the distribution of energy or intensity, respectively, over the pupil facet mirror 18. In order to do so, the distribution of intensity 35—and thus the pupil facet mirror 18—is subdivided into eight octants which are numbered in an anticlockwise direction from $O_1$ to $O_8$, as it is common in mathematics. The contribution of energy or intensity, respectively, delivered by the individual pupil facets 17 or sections thereof, respectively, in the octants $O_1$ to $O_8$ for illuminating a field point is in the following referred to as energy or intensity contribution, respectively, $I_1$ to $I_8$.

The following quantity is generally referred to as $-45°/45°$-ellipticity:

$$E_{-45/45} = \frac{I_1 + I_2 + I_5 + I_6}{I_3 + I_4 + I_7 + I_8}$$

The following quantity is referred to as 0°/90°-ellipticity:

$$E_{0/90} = \frac{I_1 + I_8 + I_4 + I_5}{I_2 + I_3 + I_6 + I_7}$$

Since the ellipticity sensor is positioned at an angle of 22.5° with regard to the normal case, the ellipticities obtained via the above formula do not apply to the angles 0°/90° and −45°/45° but to 22.5°/112.5° and −22.5°/67.5°. To simplify matters, however, the designations −45°/45°- and 0°/90°-ellipticity are retained in this document.

The determined ellipticity is generally a scan-integrated one, with the ellipticity value being obtained by integration over y, i.e. via the scanning process, at a particular x-value of the object field.

In practice, the intensity or energy, respectively, of the EUV radiation 10 the field facet mirror 13 is exposed to is not constant over the entire surface of the field facet mirror 13. In practical operation, the distribution of intensity or energy, respectively, over the surface of the field facet mirror 14 differs from the ideal uniform distribution. This may have several causes.

On the one hand, the adjustment of the radiation source 3 with respect to the collector 11, or the adjustment of the collector 11 with respect to the illumination optics 4, respectively, may be imperfect or subject to thermal drifts. Such drifts may occur between the components on the support frame 24 and the other components of the illumination system 2. Other reasons causing the illumination of the field facet mirror 13 to differ from the ideal case may be due to the extended shape of the radiation source 3. When using a plasma source as radiation source 3, electrode abrasion or plasma migration may cause the illumination distribution to drift on the field facet mirror 13 at a time constant in the range of minutes to hours. A drift may also be caused by longer periods of operation resulting in a deformation of the collector 11, or by contamination resulting in a change of its reflection properties. A not perfectly uniform illumination of the field facet mirror 13 may for example be caused due to the design of the collector 11 being provided with support spokes between the individual collector shells. These spokes block a certain amount of the EUV radiation which is then no longer available for the illumination of the field facet mirror 13.

Even a field facet mirror 13 which is illuminated in a perfectly homogeneous manner does not guarantee a correspondingly perfect illumination of the object field. In addition, the illumination of the object field may be affected due to the design of the illumination optics 4 and due to inhomogeneous reflection losses at the several deflection elements.

In the ideal case, the individual pupil facets 17 are exposed to the partial radiation beams emitted by the individual field facets in a way that a centroid of energy or intensity, respectively, of the exposure is in the exact centre of the pupil facet mirror 18 and that random surface sections, in particular random sections of the pupil facet mirror 18, are exposed to the same amount of energy or intensity, respectively.

The position of the centroid of energy or intensity, respectively, is measured in terms of telecentricity.

A centroid beam of a light bundle associated with each field point is defined in each field point of the illuminated object field. The energy-weighted direction of the centroid beam corresponds to that of the light bundle emitted by this field point. In the ideal case, the centroid beam of each field point runs parallel to the main beam emitted by the illumination optics 4 or the projection optics 7, respectively.

The direction of the main beam $\vec{s}_0(x,y)$ is known from the design data of the illumination optics 4 or the projection optics 7, respectively. The main beam is defined at a field point by the connection line between the field point and the centre of the entrance pupil of the projection optics 7. The direction of the centroid beam at a field point x, y in the object field in the object plane is obtained as follows:

$$\vec{s}(x, y) = \frac{1}{\tilde{E}(x, y)} \int du\,dv \binom{u}{v} E(u, v, x, y).$$

E (u, v, x, y) refers to the energy distribution for the field point x, y as a function of the pupil coordinates u, v, i.e. as a function of the illumination angle seen by the corresponding field point x, y.

In this respect, $\tilde{E}(x, y) = \int du\,dv\, E(u, v, x, y)$ refers to the total energy the point x, y is exposed to.

The radiation of a partial radiation beam is seen by a, for example, central object field point $x_0, y_0$ from directions u, v which are defined by the positions of the corresponding individual pupil facets 17.

At this illumination, the centroid beam is not directed along the main beam unless the different energies or intensities, respectively, associated with the individual pupil facets 17 combine to form a centroid beam direction which is integrated over all individual pupil facets 17 and runs parallel to the main beam direction. This happens only in the ideal case. In practice, there is a difference between the centroid beam direction $\vec{s}(x, y)$ and the main beam direction $\vec{s}_0(x, y)$ which is referred to as telecentricity error $\vec{t}(x, y)$:

$$\vec{t}(x,y) = \vec{s}(x,y) - \vec{s}_0(x,y)$$

During the practical operation of the projection exposure apparatus 1, it is not the static telecentricity error in a particular object field that should be corrected but the scan-integrated telecentricity error at $x=x_0$ which is obtained as follows:

$$\vec{T}(x_0) = \frac{\int dy \tilde{E}(x_0, y) \vec{t}(x_0, y)}{\int dy \tilde{E}(x_0, y)}.$$

Accordingly, the telecentricity error is corrected which is seen energy-weighted and integrated by a point on a given field height (x, e.g. $x_0$) moving through the object field in the object plane 5 during a scan.

The projection exposure apparatus 1 is equipped with the illumination-angle diaphragm device 19 for the corrective adjustment of both ellipticity and telecentricity. The embodiment of this illumination-angle diaphragm device 19 shown in FIG. 5 includes eight individual diaphragm bodies 36 to 43 the numbering of which starts with the individual diaphragm body 36 disposed at the 3 o'clock position of the pupil facet mirror 18 and continues in an anticlockwise direction. The number of the individual diaphragm bodies 36 to 43 thus equals the number of the octants $I_1$ to $O_8$. Starting from the edge, the individual diaphragm bodies are radially insertable into the illuminated aperture of the pupil facet mirror 18 independently of each other. The individual diaphragm bodies 36 to 43 are arranged around the pupil facet mirror 18 in a uniformly distributed manner so that the directions of insertion of adjacent individual diaphragm bodies 36 to 43 have an angle of 45° with respect to each other.

The individual diaphragm bodies 36, 38, 40 and 42 have a leading edge contour 44, 45 which is adapted to the illumination substructure of the pupil plane to be shadowed, i.e. to the hexagonal closest packing of the individual pupil facets 17. The individual diaphragm bodies 36, 40 which are disposed in the 3 and 9 o'clock positions in FIG. 5 have four adjacent circular diaphragm sections 46 each, with the size and shape thereof equaling the size and shape of one individual pupil facet 17 each. The edge contour 44 is formed by the combined diaphragm sections 46. The edge contours 45 of the individual diaphragm bodies 38, 42 which are disposed in the 12 or 6 o'clock positions, respectively, in FIG. 5 are composed of four diaphragm sections 46 each which correspond to the individual pupil facets 17. Due to the hexagonal close packed arrangement of the individual pupil facets 17, the diaphragm sections 46 of the edge contours 45 are not disposed next to each other but in pairs the two partners of which being offset from each other by half a diaphragm section.

The other individual diaphragm bodies 37, 39, 41 and 43 of the illumination-angle diaphragm device 19 are each of rectangular shape, the edge contours thereof thus not being adapted to the substructure of the pupil plane illumination. The individual diaphragm bodies 37, 39, 41 and 43 cover a surface corresponding to several adjacent individual pupil facets.

A default amount of intensity of the EUV radiation 10 can be blocked in one of the octants $O_1$ to $O_8$ by inserting the individual diaphragm bodies 36 to 43 into the aperture of the pupil facet mirror 18. Correspondingly, ellipticity on the one hand and telecentricity on the other hand can be altered by inserting particular individual diaphragm bodies 36 to 43.

Figure 6:
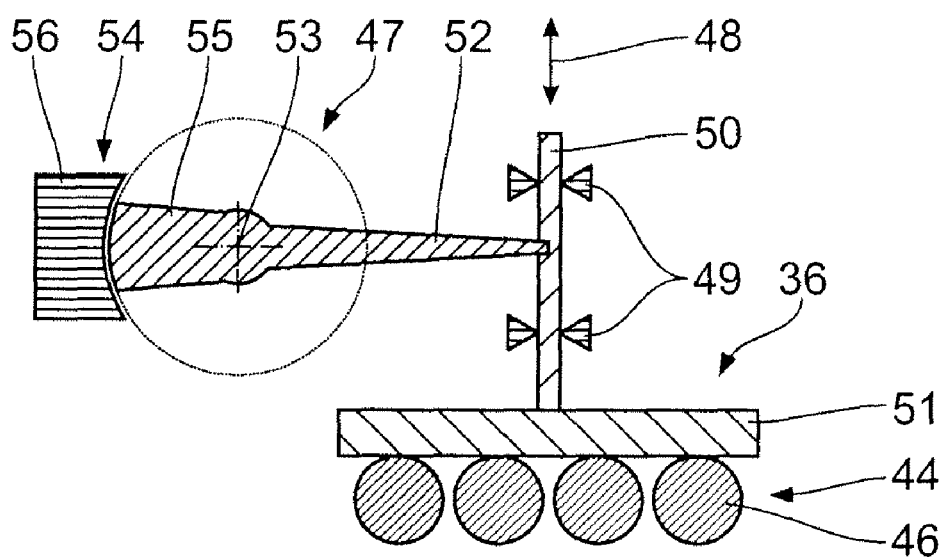
FIG. 6 shows an enlarged individual diaphragm body of the diaphragm device of FIG. 5 equipped with an insertion drive.

The following is a description, via the example of the individual diaphragm body 36 (cp. FIG. 6), of the design of an insertion drive cooperating with each of the individual diaphragm bodies 36 to 43. The insertion drive 47 includes a guide unit 49 guiding the insertion movement in the direction of insertion 48. The guide unit 49 guides a guide body 50 in the shape of a guide rod which is connected to a base body 51 of the individual diaphragm body 36. In the case of the individual diaphragm body 36, it is the base body 51 which carries the four diaphragm sections 46 of the edge contour 44.

The insertion drive 47 further includes a pivotable lever arm 52 which is articulated with the guide body 50. The lever arm 52 is pivotally drivable about a stationary pivot axis 53. In order to do so, the lever arm 52 cooperates with a pivot drive motor 54 of the insertion drive 47. The pivot drive motor 54 is configured as an electric motor. A portion of the lever arm 52 facing away from the guide body 50 forms a rotor 55 of the pivot drive motor 54, the rotor 55 cooperating with a stator 56.

Figure 7:
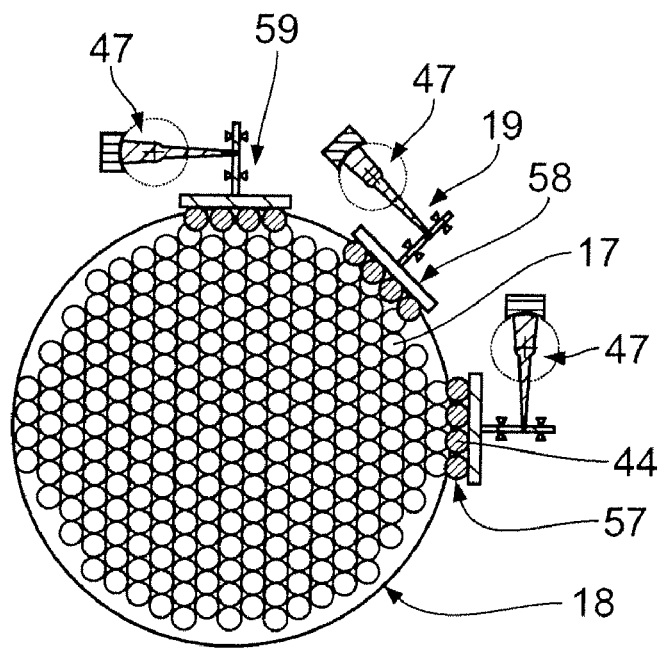
FIG. 7 shows the pupil facet mirror of an illumination.

FIG. 7 shows an alternative version of an illumination-angle diaphragm device 19 including three individual diaphragm bodies 57, 58, 59 the design of which equals that of the individual diaphragm body 36 in FIG. 6. In the embodiment of the illumination-angle diaphragm device in FIG. 7, the individual diaphragm bodies 57 to 59 are disposed at the site of the individual diaphragm bodies 36 to 38 in the embodiment of FIG. 5. The other five individual diaphragm bodies are omitted in the representation of FIG. 7. Along with the detailed design of the individual diaphragm bodies 57 to 59, FIG. 7 also illustrates the compact arrangement of the insertion drives 47 around the pupil facet mirror 18.

FIG. 8 shows a detailed view of the field-distribution diaphragm device 16 together with the field facet mirror 13.

The field-distribution diaphragm device 16 allows to adjust the uniformity, i.e. the homogeneity of the scanning energy (SE) over the field height x, i.e. the energy or intensity, respectively, seen by a field point, scanned over the object field, which is integrated over all directions.

In general, the following applies:

$SE(x)=\int E(x,y)dy$, with

E being the intensity distribution in the x-y field plane as a function of x and y. In order to achieve a uniform, i.e. homogeneous illumination and other characteristic quantities of the illumination system, such as ellipticity and telecentricity which are also functions of the field height x, it is advantageous if these quantities have substantially constant values with only minor deviations substantially over the entire field height x.

The uniformity of the scanning energy in the field plane is measured in terms of the variation of the scanning energy over the field height. The uniformity is thus described in percent via the following equation with regard to the uniformity error:

$$\Delta SE = \frac{SE_{max} - SE_{min}}{SE_{max} + SE_{min}} \times 100[\%]$$

In this equation, the following applies:
ΔSE: the uniformity error or the variation of the scanning energy, respectively, in %;
$SE_{max}$: maximum value of the scanning energy;
$SE_{min}$: minimum value of the scanning energy.

The field-distribution diaphragm device 16 allows for an adjustable, partial attenuation of illumination light of the radiation source 3 in the area of a field plane of the illumination optics 4. To this end, the field-distribution diaphragm device 16 is provided with a plurality of individual diaphragm bodies 60, with the exemplified embodiment of FIG. 8 including a total of eight individual diaphragm bodies 60. Starting from the edge of the field facet mirror 13, these individual diaphragm bodies 60 are radially insertable into the illuminated aperture, i.e. into the illuminated aperture of the field plane, independently of each other. The eight individual diaphragm bodies 60 are uniformly distributed around the circumference of the field facet mirror 13, with four of the eight individual diaphragm bodies 60 being disposed in the 3 o'clock, 6 o'clock, 9 o'clock and 12 o'clock positions and each of the other four individual diaphragm bodies 60 being disposed between two of these first four individual diaphragm bodies 60. Apart from the two individual diaphragm bodies 60 which are disposed in the 6 and 12 o'clock positions and whose edge contours 61, 62 are adapted to the arcuate shape of the individual facets 15, the shape of all individual diaphragm bodies 60 corresponds to the compressed hexagonal shape of a diaphragm section 64 leading in a direction of insertion 63.

The diaphragm sections with the edge contours 61, 62 as well as the diaphragm sections 64 are surface elements which may cover approximately half of a field facet group 14. These surface elements are not only insertable along the radial directions of insertion 63 but also pivotable about these directions of insertion 63, as can be seen from the exemplified individual diaphragm bodies 60 shown in the 3 o'clock, 6 o'clock, 9 o'clock and 12 o'clock positions in FIG. 8. The size of the surface elements of the individual diaphragm bodies 60 is adapted to the shape of the individual field facets 15 and/or to an illumination substructure of the field facet mirror 13. For example, a dimension of the diaphragm sections 64 corresponds to the dimension of the shells or of the spokes of the collector. This way, the individual diaphragm bodies 60 directly affect the scan-integrated uniformity. The uniformity is measurable via a uniformity sensor 64a which may replace the wafer 9 in the image plane 8 and is schematically indicated below the wafer 9 in FIG. 1. Likewise, the uniformity sensor 64a is a CCD array also equipped with a scintillator plate. The uniformity sensor 64a is a field-distribution sensor element in the image plane 8.

Figure 9:
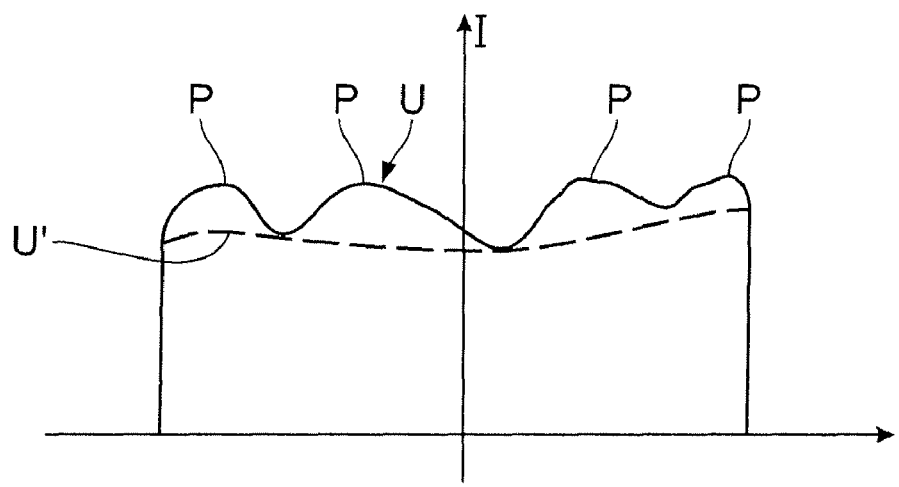
FIG. 9 shows a scan-integrated field cycle of the uniformity in an object plane of the projection exposure apparatus of an illumination system for EUV microlithography.

FIG. 9 shows a schematic example of a measured uniformity U scan-integrated over the field coordinate x. The scan-integrated intensity I is shown. The representation shows several characteristic peaks P. The width of these peaks corresponds to the width of the collector shells of the collector 11 which are imaged on the field facet mirror 13. The distribution of the uniformity according to FIG. 9 can be corrected by inserting the individual diaphragm bodies 60. In order to do so, the individual diaphragm bodies 60 are disposed at those x-coordinates where the peaks P of the uniformity occur. This way, the peaks P are reduced, with the correction thus resulting in, for example, the dashed uniformity U' the homogeneity of which is considerably greater than that of the continuous uniformity U.

When correcting the uniformity, certain individual field facets 15 are partially covered. This entails, of course, a corresponding attenuation of the illumination of the individual pupil facets 17 associated with these individual field facets. Since, however, a majority of configurations of the individual diaphragm bodies 60 result in the same correction of uniformity, that particular configuration of individual diaphragm bodies 60 may be selected in which both ellipticity and telecentricity correspond most closely to an ideal case. If necessary, adjustment and correction of uniformity on the one hand as well as ellipticity and telecentricity on the other hand may be performed in an iterative process.

Figure 10:
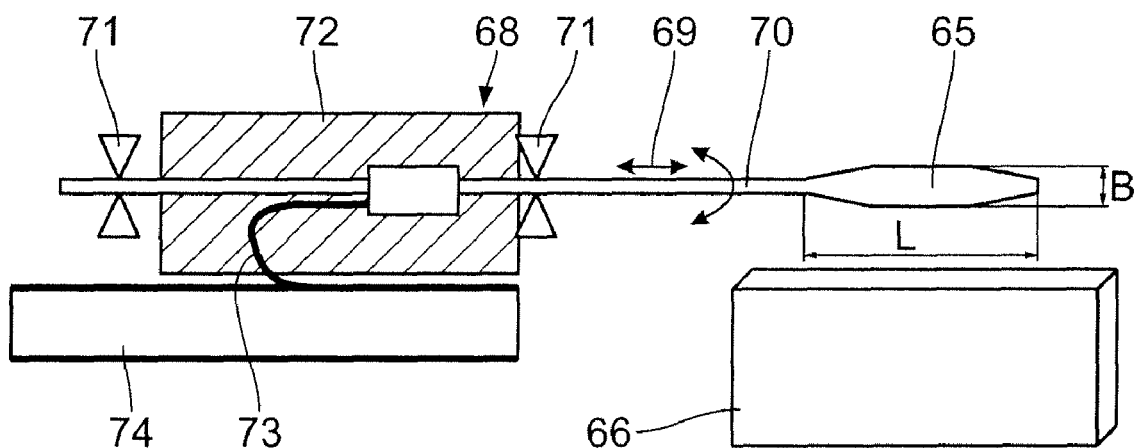
FIG. 10 shows a detailed view of an individual diaphragm body of another embodiment of a field-distribution diaphragm device.
Figure 11:
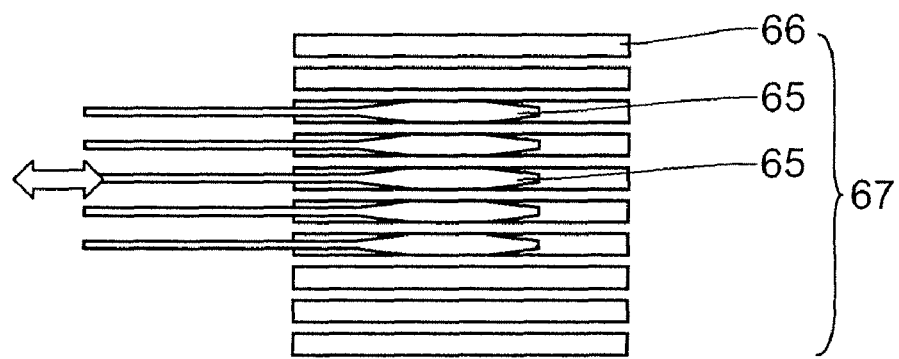
FIG. 11 shows a sectional view of another field facet mirror equipped with a plurality of individual diaphragm bodies of FIG. 10.

FIGS. 10 and 11 show a detailed view of another embodiment of a field-distribution diaphragm device. The shape of the individual diaphragm bodies 65 incorporated therein are adapted to individual field facets 66 of a field facet group 67, i.e. to an illumination substructure of the field plane to be shadowed, of another embodiment of a field facet mirror. The individual field facets 66 of this other embodiment of the field facet mirror, which may replace the field facet mirror 13 in the projection exposure apparatus 1 of FIG. 1, are not curved but have an elongated rectangular shape, i.e. they are straight. A width B of the individual diaphragm bodies 65 equals the width of the narrow sides of the individual field facets 66. A length L of the individual diaphragm bodies 65 approximately equals half the length of the long sides of the individual field facets 66.

The individual diaphragm bodies 65 are movable via an insertion and pivot drive 68 schematically represented in FIG. 10. This allows for the individual diaphragm bodies 65 to be moved along a direction of insertion 69, i.e. along a guide rod 70 which carries the individual diaphragm body 65, and to be pivoted about the direction of insertion 69, i.e. about the guide rod 70. The insertion and pivot drive 68 includes a guide unit 71 for guiding the guide rod 70 along the direction of insertion 69. A linear/pivot drive motor 72 serves, on the one hand, to pivot the individual diaphragm body 65 about the direction of insertion 69 and, on the other hand, to move the individual diaphragm body 65 along the direction of insertion 69.

The individual diaphragm body 65 is coupled to a cooling body 74 via the guide rod 70 and a flexible copper line 73. Corresponding to the individual diaphragm body 65, the individual diaphragm bodies 36 to 43, 57 to 59 or 60 may also be cooled.

FIG. 1 schematically represents other components for measurement, control or calculation, respectively, which may serve to automatically correct both ellipticity and telecentricity as well as the uniformity of the projection exposure apparatus 1.

The ellipticity sensor 25 is connected to an evaluation device 76 via a signal connection 75. The evaluation device 76 is connected to the uniformity sensor 64a via a signal line 77. The evaluation device 76 thus serves both as an illumination-angle evaluation device as well as a field-distribution evaluation device. A nominal illumination-angle distribution is stored in the evaluation device 76. This nominal illumination-angle distribution may be the result of a calibration measurement of the illumination-angle distribution. Moreover, a nominal intensity distribution is also stored in the evaluation device. This nominal intensity distribution may be the result of a calibration uniformity measurement. A signal connection is provided between the evaluation device 76 and a control device 79 via a signal line 78, the control device 79 serving both as an illumination-angle control device as well as a field-distribution control device. A signal connection is provided between the control device 79 and the illumination-angle diaphragm device 19 via a signal line 80 and between the control device 79 and the field-distribution diaphragm device 16 via a signal line 81.

For correcting the ellipticity of the illumination-angle distribution in the projection exposure apparatus 1, the actual ellipticity is, in a first step, measured via the illumination-angle sensor element 25. In a second step, it is determined which of the illumination sectors, i.e. which of the octants $O_1$ to $O_8$, is to be used for correcting the ellipticity via the illumination-angle diaphragm device. This happens via the evaluation device 76 which determines the weighting between the octants $O_1$ to $O_8$ and, with regard to the nominal average illumination distribution stored in the evaluation device 76, defines the octant $O_1$ to $O_8$ the shadowing of which is to be increased, for example. Subsequently, the selected illumination sector and the amount of shadowing to be selected are transmitted from the evaluation device 76 to the control device 79 via the signal line 78. The control device 79 then generates an illumination-angle control signal for actuating the particular individual diaphragm body 36 to 43 in the embodiment of FIG. 5, or the corresponding diaphragm body of the embodiment of FIG. 7, respectively, which is associated with the selected illumination sector. This selected individual diaphragm body, e.g. the individual diaphragm body 36 in the embodiment of FIG. 5, is then moved into this section so that illumination light of the radiation source 3 is partially attenuated in the area of the illumination sector to be corrected, for example the illumination sector $O_1$.

Corresponding to the above description in terms of ellipticity correction, it is also possible to correct the telecentricity of the illumination.

A first step for correcting the uniformity of the field-plane intensity distribution in the projection exposure apparatus 1 is to measure an actual uniformity via the uniformity sensor 64a. In a second step, the evaluation device 76 is used to determine, with regard to the nominal intensity distribution stored therein, a field section, i.e. an area between two x-values of the field coordinate, which is to be corrected. This field section to be corrected and the amount of correction to be generated are then transmitted from the evaluation device 76 to the control device 79. The control device 79 then generates a field-distribution control signal for actuating at least that diaphragm body 60 or 65, respectively, which is associated with the field section to be corrected. Subsequently, the respective diaphragm body 60, 65 is inserted or pivoted, respectively, so as to partially attenuate the light of the radiation source 3 in the area of the at least one field section to be corrected, thus obtaining the desired correction of uniformity.

Unwanted interactions between the correction of ellipticity and telecentricity on the one hand and the correction of uniformity on the other hand may be reduced to a minimum by iteratively performing the correction methods.

The direction of insertion runs parallel to the reflection plane of the field facet mirror 13, i.e. substantially parallel to a field plane in which the field facet mirror 13 is disposed. It generally suffices if at least one direction component of the direction of insertion 63 runs parallel to the field plane. Correspondingly, the same applies to the directions of insertion 48 (cp. FIG. 6) and 69 (cp. FIG. 10).

What is claimed is:

1. An illumination system, comprising:
    an illumination optics designed so that, during use, the illumination optics can guide light from a radiation source to an object field in an object plane;
    an illumination-angle sensor element designed so that, during use, the illumination-angle sensor can determine an actual illumination-angle distribution of a projection exposure apparatus in a field plane of the illumination optics;
    an illumination-angle evaluation device comprising a signal connection to the illumination-angle sensor element, the illumination-angle evaluation device being designed so that, during use, a nominal illumination-angle distribution is stored via the illumination-angle evaluation device;
    an illumination-angle control device comprising a signal connection to the illumination-angle evaluation device, the illumination-angle control device being designed so that, during use, the illumination-angle control device generates an illumination-angle control signal depending on a difference between the actual illumination-angle distribution and the nominal illumination-angle distribution; and
    at least one movable illumination-angle diaphragm device comprising a signal connection to the illumination-angle control device, the at least one movable illumination-angle diaphragm device being configured so that, during use, the at least one illumination-angle diaphragm device can move at least one illumination-angle diaphragm body to achieve an adjustable, partial attenuation of the light in an area of a pupil plane of the illumination optics,
    wherein:
        the illumination system is an EUV microlithography illumination system; and
        the illumination-angle sensor element is configured so that, during use of the illumination system to illuminate the object field, the illumination-angle sensor monitors the actual illumination-angle distribution of the light.

2. An illumination system according to claim 1 wherein, during use, the illumination-angle sensor element detects an illumination-angle distribution over the entire field plane.

3. An illumination system according to claim 1 wherein, during use, the illumination-angle sensor element detects an illumination-angle distribution in at least one field position by using light at the edge of a cross-section of the light.

4. An illumination system according to claim 3 wherein the illumination-angle sensor element comprises at least one deflection element configured so that, during use, the at least one deflection element can deflect a detection beam path of the illumination-angle sensor element away from a main beam direction of the illumination light.

5. An illumination system according to claim 3 wherein, during use, the illumination-angle sensor element detects the illumination-angle distribution by using light at four edge positions of the cross-section of the light, the edge positions defining the corners of a rectangle.

6. An illumination system according to claim 5 wherein the illumination-angle sensor element is designed so that, during use, the illumination-angle sensor element can detect illumination angles and, at the same time, an integral of the light arriving from all detected illumination angles.

7. An illumination system according to claim 6 wherein the illumination-angle sensor element comprises:
    a second diaphragm disposed so that, during use, the second diaphragm is at a position in a field plane, or a plane of the illumination optics conjugated thereto, which may be exposed to the light;
    a spatial detector element disposed so that, during use, the spatial detector element is downstream of the second diaphragm, and so that the spatial detector element can, during use, detect an intensity distribution which corresponds to the illumination-angle distribution at the site of the second diaphragm,
    wherein the second diaphragm has an aperture.

8. An illumination system according to claim 7 wherein the spatial detector element comprises a CCD array.

9. An illumination system according to claim 8 wherein the CCD array comprises a conversion element configured so that, during use, the conversion element can convert a wavelength of the light into a wavelength detectable by the CCD array.

10. An illumination system according to claim 9 wherein the at least one movable illumination-angle diaphragm device comprises a plurality of individual diaphragm bodies which are insertable into an illuminated aperture of the pupil plane independently of each other.

11. An illumination system according to claim 10 comprising at least one individual diaphragm body having an edge contour which leads in the direction of insertion and is adapted to an illumination substructure of the pupil plane to be shadowed.

12. An illumination system according to claim 10 wherein a number of the individual diaphragm bodies is adapted to illumination parameters to be corrected.

13. An illumination system according to claim 12 further comprising an insertion drive designed to cooperate with an individual diaphragm body, the insertion drive comprising:
    a guide unit configured to be capable of guiding insertion movement;
    a pivotable lever arm articulated with a guide body which can be guided in the guide unit and firmly connected to a base body of the individual diaphragm body; and
    a pivot drive motor, the lever arm being capable of cooperating with the pivot drive motor.

14. An illumination system according to claim 13 wherein the pivot drive motor is an electric motor, and a portion of the lever arm simultaneously forms a rotor of the electric motor.

* * * * *

UNITED STATES PATENT AND TRADEMARK OFFICE
CERTIFICATE OF CORRECTION

| | | |
|---|---|---|
| PATENT NO. | : 7,990,520 B2 | |
| APPLICATION NO. | : 11/957647 | |
| DATED | : August 2, 2011 | |
| INVENTOR(S) | : Berndt Warm et al. | |

It is certified that error appears in the above-identified patent and that said Letters Patent is hereby corrected as shown below:

Column 4, line 39, delete "correaction" insert --correction--;

Column 5, line 49, delete "which an the" insert --which the--;

Column 7, line 41, delete "trans-mission" insert --transmission--;

Column 11, line 20, delete "$I_1$ to $O_8$" insert --$O_1$ to $O_8$--.

Signed and Sealed this
Eighth Day of November, 2011

David J. Kappos
*Director of the United States Patent and Trademark Office*